United States Patent [19]
Atwood et al.

[11] Patent Number: 5,230,970
[45] Date of Patent: * Jul. 27, 1993

[54] METHOD OF FORMING METAL REGIONS

[75] Inventors: Donald K. Atwood; Georgia J. Fisanick, both of Warren; Michal E. Gross, Summit, all of N.J.; Abraham Katzir, Tel Aviv, Israel; Gary L. Wolk, West Trenton, N.J.

[73] Assignee: AT&T Bell Laboratories, Murray Hill, N.J.

[ * ] Notice: The portion of the term of this patent subsequent to Jan. 13, 2004 has been disclaimed.

[21] Appl. No.: 890,047

[22] Filed: May 28, 1992

Related U.S. Application Data

[63] Continuation of Ser. No. 622,127, Dec. 3, 1990, abandoned, which is a continuation of Ser. No. 445,129, Nov. 27, 1989, abandoned, which is a continuation of Ser. No. 86,210, Aug. 17, 1987, abandoned, which is a continuation of Ser. No. 735,851, May 20, 1985, abandoned.

[51] Int. Cl.$^5$ ............................ G03C 1/72; G03F 1/00
[52] U.S. Cl. .......................................... 430/5; 430/269; 430/346; 430/348; 430/494; 430/495; 430/945; 430/947; 430/964; 427/10; 427/555; 427/596; 427/557

[58] Field of Search .................... 430/5, 346, 348, 616, 430/494, 492, 269, 945, 947, 964; 427/10, 53.1, 56.1

[56] References Cited

U.S. PATENT DOCUMENTS

| 4,328,303 | 5/1982 | Ronn et al. | 430/495 |
| 4,444,801 | 4/1984 | Hongo et al. | 430/5 |
| 4,463,073 | 7/1984 | Miyauchi et al. | 430/5 |
| 4,636,403 | 1/1987 | Fisanick et al. | 430/945 |

OTHER PUBLICATIONS

Randall et al., "Repair of X-rays . . . ", *J. Vac. Sci. Techn.*, B 3(1), Jan./Feb. 1985, pp. 262-264.
Gross et al., "Laser Direct-Write . . . ", *J of Applied Physics*, Feb. 1987.

*Primary Examiner*—Richard L. Schilling
*Attorney, Agent, or Firm*—Bruce S. Schneider

[57] ABSTRACT

A process of radiation-induced formation of a uniform metal or metal oxide region suitable for device application or for repairing transparent defects in pattern metal films of lithographic masks has been found. The process requires that the heat evolved during the radiation-induced reactions be carefully limited to produce the desired uniformity.

14 Claims, 3 Drawing Sheets

FIG. 3
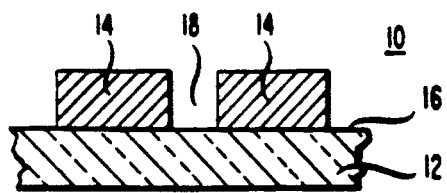
FIG. 3A
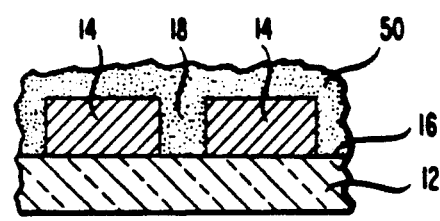
FIG. 3B
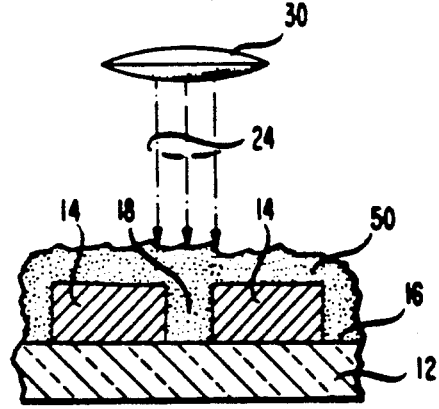
FIG. 3C
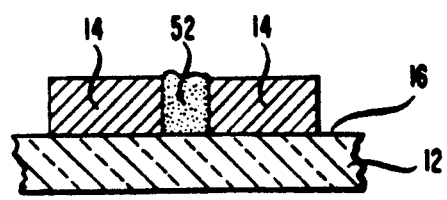
FIG. 3D

METHOD OF FORMING METAL REGIONS

This is a continuation of application Ser. No. 07/622,127 filed Dec. 3, 1990, which is a continuation of Ser. No. 07/445,129, filed Nov. 27, 1989, which is a continuation of Ser. No. 07/086,210, filed Aug. 17, 1987, which is a continuation of Ser. No. 06/735,851, filed May 20, 1985, all now abandoned.

TECHNICAL FIELD

This invention relates to a method of forming a metal or metal oxide region on a substrate. More particularly, the present invention relates to metal or metal oxide regions employed in device fabrication.

BACKGROUND OF THE INVENTION

In the fabrication of devices, e.g., semiconductor devices or magnetic bubble devices, it is generally necessary to form on a substrate a metallic or metal oxide region having a specific spatial pattern and location. (A substrate is a mechanically stable body including either a bulk material upon which a device is to be formed, e.g., bulk silicon, or including the bulk material and other regions, e.g., metal regions, insulating regions, or semiconductor regions, formed during the processing of the device.) The positioning and patterning of metal or metal oxide regions are often accomplished by a lithographic process. In this process, a mask is used to image energy into the desired two-dimensional pattern on the substrate surface coated with an energy-sensitive resist material. The mask is placed in contact with or in close spatial relation to the substrate. Alternatively, the mask pattern is projected onto the substrate.

After the selective exposure, a procedure is employed to remove portions of the resist and thus to expose corresponding portions of the substrate. For example, a solvent or energetic entities from a plasma are utilized to accomplish the desired removal. The resulting patterned energy-sensitive material, i.e., resist, is employable as a processing mask for a variety of procedures, such as selective doping, etching, or oxidizing the exposed substrate. Alternatively, in a procedure denominated lift-off, a metal is deposited on the pattern and thus also onto the exposed portions of the substrate. The resist is then totally removed, for example, with a suitable solvent, leaving a patterned metal region.

Although the formation of metal or metal oxide patterns in device fabrication is most commonly employed for producing, respectively, electrically conductive or insulating regions in a device, other application also require the selective deposition of a metal or metal oxide region. For example, the mask utilized in the previously described patterning procedure generally comprises a patterned metal or metal oxide film, such as a chromium, chromium oxide, or nickel film in the case of a photomask, or a gold film in the case of an X-ray mask, generally having a thickness of approximately 500 to 1000 Angstroms in the former case and 3500 to 8000 Angstroms in the latter. The mask is generally formed on a base which is transparent to the incident radiation, such as a quartz or glass base having a thickness of 0.06 to 0.09 inches for the photomask, and a dielectric film, e.g., a boron nitride/polyimide composite film, in the X-ray case. The mask is typically manufactured by depositing a thin film of the metal or metal oxide onto the entire surface of a substrate. This film is then coated with a resist which is sequentially exposed, developed, and the film selectively removed in the exposed area by etching, leaving the desired pattern. (See D. J. Elliott, *Integrated Circuit Fabrication Technology*, McGraw-Hill, New York, 1982, and D. K. Atwood et al, *Proceedings of the SPIE*, Vol. 471, Santa Clara, March 1984, page 127, for a description of the fabrication of photo and X-ray masks, respectively.)

In the manufacture of a mask, transparent defects such as pinholes or missing portions of metal or metal oxide film often occur. These defects in turn cause defects in the integrated circuits or other devices produced when using such masks. Since the manufacture of masks is generally a time-consuming and relatively expensive operation, it is often desirable to repair a defective mask by selectively depositing an opaque metal or metal oxide film on the undesired transparent region. (Transparent and opaque are terms employed in relation to the exposing radiation.)

Techniques for the selected deposition of metals or metal oxides have also been used in the repair of masks, but have several disadvantages in this application. For example, the resist which is applied and developed to expose the transparent mask regions may itself develop pinholes, thus causing the metallic film to be ultimately deposited in areas other than undesirable transparent regions. This unwanted deposition creates what is known as opaque defects on the transparent substrate that then need to be corrected. Additionally, the metallic film deposited on the mask may have poor adhesion and thus be removed during the concomitant removal of the resist material. (The degree of adhesion required for photomasks is much higher than for X-ray masks because of the scrubbing and cleaning procedures associated with the use of the photomask.) Finally, such a technique requires many steps and is time-consuming.

Laser-writing procedures have been considered for the repair of photomasks because they are not only less time-consuming but also offer the possibility of producing a film in only the defect areas. For example, as described in U.S. Pat. No. 4,340,654, dated Jul. 20, 1982, laser energy was utilized to fuse an opaque coating material to a photomask substrate surface at the location of the transparent defect. Unfortunately, fusion causes physical and optical damage to the substrate and deposited coating material. Thus, if too large an area or the wrong area of the mask substrate is exposed, it would be impossible to correct the newly formed opaque area with standard repair techniques since the underlying substrate is now damaged or removed.

Another method depending upon the use of a directed laser beam is described in U.S. Pat. No. 4,444,801, dated Apr. 24, 1984. This method utilizes laser-induced metal deposition and provides that an organometallic complex solution be applied either to the entire surface of the photomask having transparent defects or only to the transparent defect portion and its periphery. Each transparent defect is then exposed to visible or ultraviolet light to induce deposition of a metal into the transparent defect, thereby correcting the defect on the photomask pattern. However, the formed metal region is not adherent and requires a protective covering to maintain its integrity.

Because the opaque pattern in X-ray masks is formed on an extremely thin film, repair of pattern defects is quite difficult. For instance, because it is not possible to lift off a metal region thick enough to be opaque to X-rays, the previously described lift-off techniques are not applicable. J. N. Randall et al, "Repair of X-ray Lithography Masks Using UV Laser Photodeposition," *Journal of Vacuum Science and Technology B*, Vol. 3, No. 1, Jan./Feb. 1985, have suggested repairing masks by flowing an organometallic gaseous material, e.g., dimethyl cadmium and tetraethyl lead, over the mask surface and irradiating the defect areas of the mask with laser radiation. Thus, deposition from the gas phase onto the defected portion of the mask is induced. However, this deposition is extremely inefficient and requires special handling techniques.

SUMMARY OF THE INVENTION

It has been found that exposure of a solid organometallic material, i.e., a material containing metal atoms and organic moieties, such as a gold mercaptide, palladium acetate, or titanium carboxylates, to a localized energy source induces exothermic decomposition and generally produces an uncontrolled reaction. This uncontrolled reaction, resulting from a corresponding uncontrolled release of thermal energy, yields irregular deposition, i.e., depositions having discontinuities or periodic non-uniformities and formation of metal or metal oxide regions significantly larger than the region impacted by the exposing radiation. Indeed, the temperature rise is often so abrupt that the organic component becomes charred, and an undesired non-volatile, non-adherent residue is formed with the deposited metal. By controlling the thermal release of energy, spatially regular and well-defined metal or metal oxide deposition is produced.

A variety of expedients are available for controlling heat evolution. For example, an organometallic material undergoing endothermic rather than exothermic chemical reaction is employed. Alternatively, the energy source, e.g., the laser, is ramped to provide an initially low and steadily increasing energy density. This expedient also includes such processes as scanning of a cw laser beam at a controlled rate. The resulting spatially well-defined regions are usefully employed in mask repair and in conductive device pattern production.

BRIEF DESCRIPTION OF THE DRAWING

FIGS. 3A-3D are partial cross-sectional views of the mask taken through 3—3 shown in FIG. 1 illustrating the transparent defect repair process steps.

DETAILED DESCRIPTION

The instant invention is described in terms of repairing transparent defects in the metallized pattern of a mask. However, such description is for purposes of exposition and not for limitation, for the instant technique can be effectively used to deposit a spatially defined metallic or metal oxide region in other applications such as device applications, e.g., metal conductors in semiconductor devices. In such device applications, after the metallization is performed, conventional steps, e.g., deposition, etching, and passivation, are performed to complete the device.

Figure 1:
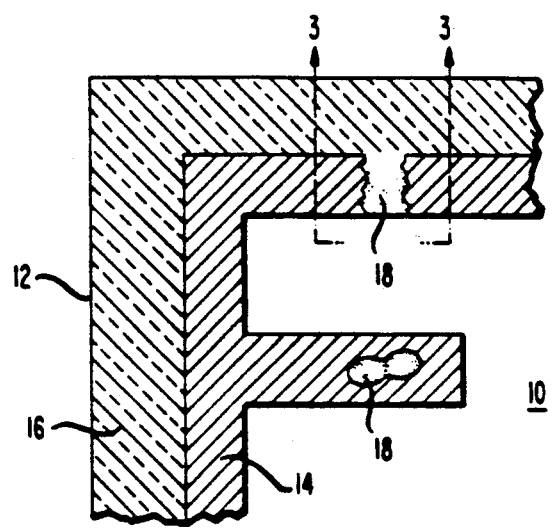
FIG. 1 is a partial top view of a photomask having typical transparent defects.

Referring to FIG. 1, there is shown a portion of a mask 10 comprising a transparent substrate 12, such as a sheet of glass or quartz in the case of a photomask or a boron nitride/polyimide composite in the case of an X-ray mask, having a patterned metallic film 14 such as a layer of chromium, nickel, aluminum, or the like in the former case, or gold, tungsten, rhenium, platinum, and/or lead in the latter, formed on one surface 16 of the mask 10. Typically, the patterned film 14 is approximately 500 to 1000 Angstroms thick for a photomask or 3500 to 8000 Angstroms thick for an X-ray mask. The patterned film 14 may be formed by photolithographic means as previously described. The mask 10 may have one or more defects, particularly transparent-type defects 18—18 which are essentially breaks or holes in the patterned film 14. Typically, the defects 18—18 are from 5 to 10 micrometers in diameter. However, defects as small as 0.5 to 1.0 micrometers, as well as larger defects, are not unusual. The first step in producing a patterned metallic material with a well-defined spatial cross section, i.e., a cross section varying no more than 10 percent, measured in the direction normal to the substrate which defines the smallest cross-sectional dimension, is the formation of an organometallic material, e.g., an organometallic gold screen ink, a titanium carboxylate screen ink, or a region of palladium acetate, on the substrate surface area to receive the metal or metal oxide pattern. (The titanium ink produces an oxide. The palladium compound produces a mixture of metal and metal oxide, and the gold material forms elemental gold because of the inertness of the gold.) Conventional techniques are utilized. For example, an organometallic screen ink such as Bright Gold A3728 (a proprietary product of Engelhard Corporation) is applied by spin-coating, spraying, or brushing. Alternatively, a material such as palladium acetate is applied by conventional techniques such as spin-coating from solution. The thickness of the coating should be significantly thicker, e.g., 10 times thicker, than the thickness desired for the ultimate metal pattern. Typically after chemical reaction, the organometallic film loses more than 90 percent of its volume. Mass loss corresponds to loss of non-metallic film portions such as resin binders, oils, and metal ligands. The precise amount of volume lost depends on a wide variety of parameters, such as the metal content of the precursor film, the density of the organometallic film relative to the elemental metal, and the exposure parameters. A control sample is utilized to determine the precise thickness of organometallic film to yield a desired metal region thickness after decomposition. For example, for a typical 4 inch×4 inch photomask, approximately 2 grams of Engelhard Bright Gold A3728 are spun onto the surface at a speed of 3000 rpm for 60 seconds. The coated mask is then typically dried, e.g., 20 minutes at 90 degrees C., to remove organic solvents and to produce a layer thickness of approximately 1.6 $\mu$m. However, the thickness of the coating should not substantially exceed the distance that the exposing source is capable of penetrating into the coating. If, for example, all the exposing radiation is absorbed before traversing the coating thickness, an unexposed and thus unconverted layer remains.

The organometallic material is then illuminated in the desired pattern by a suitable energy source. For example, a laser beam or a focused source of noncoherent radiation is employed. The energy source is chosen to induce a decomposition of the organometallic material and a resulting formation of an elemental metal or a metal oxide region. The energy, e.g., wavelength of light, is chosen so it is sufficient to induce the desired reaction and so that, as previously discussed, it is not completely absorbed before converting the entire thickness of the illuminated region. The rate at which energy is supplied to a region of the organometallic surface to be exposed should be carefully controlled in conjunction with the organometallic composition to prevent excessive evolution of heat, i.e., to ensure that the local rate of reaction is controlled by the localized energy source and not by the heat evolved during the reaction itself. In particular, an expedient is employed, i.e., the composition and exposure parameters are controlled so that 1) essentially all the reactive illuminated material to be converted undergoes this reaction, 2) the supplied energy is limited sufficiently so that the organometallic material, intermediate, or metal or metal oxide reaction product is not ablated, and 3) for all points within a region where metal or metal oxide formation is desired, the rate of energy supplied by the reaction of reactive material should be at all times less than 3 percent of the rate of incident energy capable of inducing the reaction supplied by an external source. If these criteria are satisfied, a material having a spatial and compositional uniformity is produced after removal of unreacted material. (It is possible in some applications where compositional purity is not required to relax criterion (1).)

Figure 4:
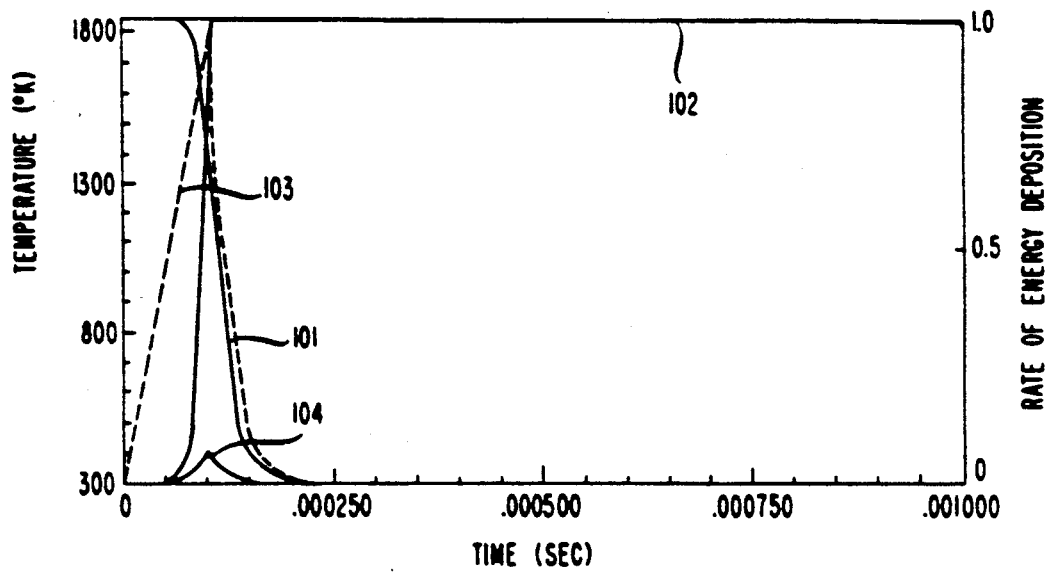
FIGS. 4 and 5 are illustrative of thermal conditions involved in the irradiation of solid organometallic material.
Figure 5:
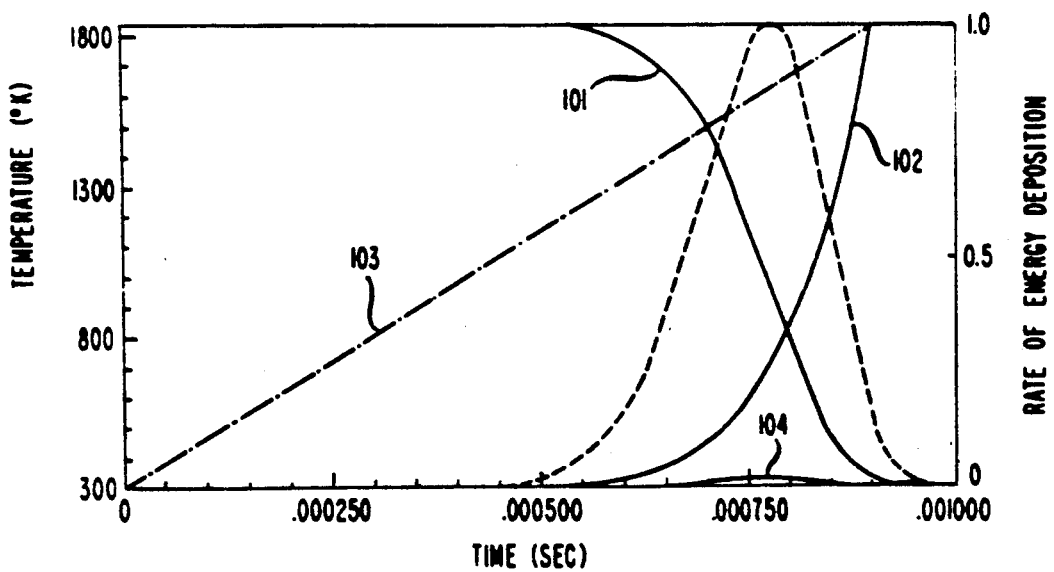

The satisfaction of criterion (3) is achieved by controlling the reaction conditions (including the composition of the material to react and the thermal properties of the underlying substrate). To determine if this criterion is satisfied, a series of differential scanning calorimetry (DSC) measurements is performed to measure the heat evolution of the precursor material being utilized. These measurements, as described in *Thermal Characterization of Polymeric Materials*, E. A. Turi, Editor, Academic Press, New York (1981), Chapters 1 and 2, allow the measurement of the total heat released during the decomposition of the precursor material, the energy barrier height for activation ($E_b$) of this decomposition, and the prefactor constant associated with Arrhenius decomposition. (The rate of organometallic material decomposition for materials of interest is aptly described by the Arrhenius equation $Ae^{-T_b/T}$ where T is the local temperature, $T_b = E_b/K$, and K is the Boltzmann constant.) The rate of temperature increase in the film due to the applied energy not including heat generated by reaction is determined by the conventional thermal diffusion calculations described, for example, in J. E. Moody and R. H. Hendel, *Journal of Applied Physics*, Vol. 53, page 4364 (1982). For a given temperature profile induced by the incident energy (excluding heat evolved from reaction), the concomitant rate of heat evolution from the induced reaction at the center of the irradiated area is calculated using the Arrhenius equation and the previously determined parameters associated with that equation. Calculated curves are shown in FIG. 4 for two ramp rates of 10 mW in 100 microseconds and 10 mW in 900 microseconds, with a spot radius of 0.5 $\mu$m and film thickness of 2.0 $\mu$m for the exemplary screen ink on quartz. For case 1, the curve of the rate of energy deposition, 104, from the reaction is strongly peaked and approximately 7 percent of that of the rate of energy input of the laser, 103. (Curve 101 in FIG. 4 is the fraction of unreacted material.) This rate of deposition of heat from the reaction results in an approximately two times increase in the local reaction rate, 102, thereby further speeding the release of heat from the reaction and causing thermal runaway. For case 2, the conditions are such that the contribution to the overall rate of reaction of the heat of reaction, 104 in FIG. 5, is always small compared to the laser energy supply rate, 103, leading to a reaction rate, 102, and to suppression of thermal runaway.

Various expedients are available for satisfying the heat limitation requirement. In one embodiment, a material is utilized that undergoes an endothermic reaction upon exposure to the energy utilized to induce the chemical reaction. Since the reaction is endothermic, it is easy to control the reaction during the production of the metal or metal oxide pattern. This control is provided by simply ensuring that sufficient energy is provided to produce complete reaction but insufficient to cause ablation. Other expedients are also available to satisfy the thermal criterion if a material is utilized that undergoes an exothermic reaction upon illumination. For example, the incident energy at any illuminated point in the organometallic film is initially presented at a low level and slowly increased until the reaction is completed. Alternatively, the incident energy is translated at a suitable rate across the organometallic material. As discussed, use of the Arrhenius equation and DSC is employed to determine if criterion (3) is satisfied. However, a series of control samples is employed to define a generally suitable parameter domain, e.g., suitable energy supply and ramping increase rates, for a given organometallic material.

Generally, in the repair of a mask, exposure in a small region is required. Thus, translation of the exposing energy, and/or the substrate, is not required. However, if a relatively large region of organometallic material is to be converted, translation of the incident energy (e.g., translation of the laser beam) and/or movement of the substrate is required. Again, the rate of translation affects the thermal evolution. Thus, this rate should be controlled in conjunction with the other parameters so that the thermal criterion is satisfied.

Although one significant aspect of the invention is the elimination of an exposure mask, the use of such a mask is not precluded. For example, it is possible to expose the organometallic regions to be converted by using a mask and a noncoherent or coherent light source. Even in this exposure procedure, to obtain a spatially uniform metallic deposition, the exposure parameters should be adjusted to satisfy the thermal criterion.

Finally, after exposure, unreacted or partially reacted material is removed by a suitable development process, i.e., a process that removes this material without substantially adversely affecting the reacted material. Development is possible utilizing solvation techniques or through reaction with the previously unreacted material. For example, unreacted palladium acetate or gold screen ink is removed by rinsing with $CH_2Cl_2$, and partially reacted regions are removed by immersion for 10 minutes in a mixture of chromic, nitric, and sulfuric acids. Additionally, it is possible to utilize a subsequent trimming of the feature by localized exposure to an ion beam or pulsed laser beam to ablate material.

In one exemplary embodiment for repairing mask defects 18, a photomask 10 with an apparatus 20 and a continuous wave argon ion laser 22 (e.g., Spectra-Physics, Inc. or Mountainview, Calif., Model 171-19) outputs a beam 24 of light energy having a wavelength of 5145 Angstroms. The laser beam 24 passes through a variable rectangular aperture 26 which directs the laser beam 24 to a lens 28. The purpose of the lens 28 is to focus the diffraction pattern of the beam 24 caused by the aperture 26 onto the back focal plane of a microscope objective 30.

Prior to passing through the aperture 26, the beam 24 passes through a first dichroic mirror 32 which reflects a white light 34 from a source 36 into a path coaxial with the beam 24. The laser beam 24 travels coaxially with the white light 34 through the lens 28 to a second dichroic mirror 38. The second dichroic mirror 38 reflects the laser beam 24 onto the objective 30 along with the white light 34. The objective 30 condenses and projects the laser beam 24 and the white light 34 to a defect portion 18 of the photomask 10. The white light 34 is used for purposes of adjusting the apparatus 20 so that the beam 24 will be directed toward the defect 18 upon actuation of the laser 22. Note that a surveillance device 40 is positioned above the mirror 38 in order to observe the photomask 10 during the repair process.

The laser 22 is connected to an external light control 42 which allows control of the laser power level. The light control 42 is powered by a voltage pulse generator 44. The generator 44 outputs a sawtooth or other ramp-type signal 46 whose peak voltage determines the final peak output power of the laser 22. In the exemplary embodiment, a 2.5 volt signal yielded a 20 watt laser beam when the exemplary laser 22, described above, is configured for maximum output power.

Figure 2:
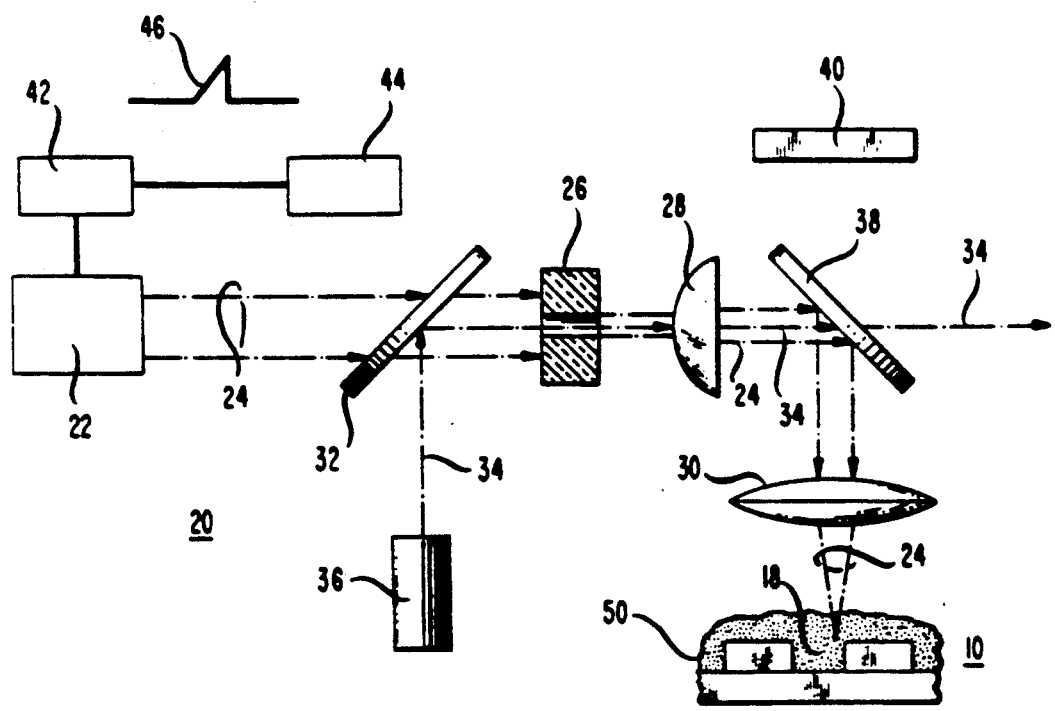
FIG. 2 is a schematic diagram of an apparatus for repairing the transparent defects in the mask of FIG. 1.

FIGS. 3A-3D illustrate the method of correcting a transparent defect 18 on the photomask 10 by use of the defect correcting apparatus 20 shown in FIG. 2. A portion of a photomask 10 with a typical transparent defect 18 in its patterned film 14 is shown in FIG. 3A. In a first step (FIG. 3B), an organometallic gold screen ink 50 is applied, via spin-coating, over the entire surface 16 of the substrate 12 to a thickness of approximately 2 micrometers. For a typical 4 inch×4 inch photomask 10, approximately 2 grams of material 50, for instance, Engelhard Bright Gold A3728 screen ink, are spun onto the surface 16 at a speed of 3000 rpm for 60 seconds. The material 50 can also be applied by spraying or brushing such that it is applied selectively to the transparent defect 18 and the nearby surrounding area. The coated photomask 10 is then typically dried for 20 minutes at 90 degrees C. to remove volatile organic solvents from the organometallic ink 50.

After drying, the photomask 10 is presented to the defect correcting apparatus 20 shown in FIG. 2 and positioned so the laser beam 24 will project onto the material 50 overlying the transparent defect 18. An operator accomplishes this by adjusting the aperture 26 so the white light 34 registers with the image of the defect 18 as viewed through the device 40. The operator then causes the voltage generator 44 to output a ramp signal 46 to the external light control 42 which actuates the laser 22. The output power of the laser 22 ramps up in concert with the output voltage of the generator 44. The beam 24 travels through the objective 30 to condense and project upon the volume of organometallic material 50 associated with the defect 18 (FIG. 3C). The output power of the laser 42 continues to increase with increasing ramp voltage until the ramp signal 46 reaches a peak and then decreases to 0 volts.

The aforementioned method of ramping the output power of the laser 42 is one of several methods that may be utilized. Other ramping methods include, but are not limited to, rotating polarizers, electro-optic or acoustic-optic methods, and graded attenuators which are moved through the laser beam 24 during a predetermined period of time. Regardless of the method, within approximately 1 second of laser beam exposure, a reflective patch 52 of metal film is formed or deposited within the defect 18 so as to repair the patterned film 14 (FIG. 3D). The adhesion of the metal patch 52 occurs between approximately 1 and 3 seconds. It should be noted that the metal adheres to the substrate and does not fuse with substrate materials. Once properly exposed, the substrate is cleaned with an appropriate solvent to remove unexposed portions of the organometallic material 50.

The laser power required to deposit an opaque, adherent metal patch 52 is dependent on the material 50, the material of the substrate 12, and the efficiency of the optical train (i.e., the lens 28, the objective 30, and the dichroic mirrors 32 and 38).

The gold screen ink (15 weight percent gold) is comprised of a gold terpene mercaptide. Basically, it is an organometallic compound dissolved in a polymer-forming compound. In particular, it is a mixture of gold chloride reacted with sulfurized terpenes to which resin binders, essential oils, and base metal brightening and adhesion agents have been added. The gold screen ink is more fully described in U.S. Pat. No. 2,490,399, by K. H. Ballard, and U.S. Pat. No. 2,984,575, by H. W. Fitch, which are incorporated by reference herein. A commercially available organometallic material 50 which undergoes exothermic decomposition is Engelhard Bright Gold A3728 screen ink manufactured by Engelhard Corporation of East Newark, N.J.. Additionally, an article entitled "How to Apply Noble Metals to Ceramics," by R. T. Hopper in *Ceramic Industry*, dated June 1963, is also incorporated by reference herein.

For the exemplary material 50 described above and an optical train having (1) a 20 cm (f/8) fused silica lens 28, (2) a 99 percent dielectric mirror 38, and (3) a 40×(N.A. 0.65) microscope objective 30, an opaque, adherent rectangular metal patch 52 of dimensions 7 micrometers×7 micrometers may be formed on a White Crown glass substrate 12 using a peak laser power of 500 milliwatts and a ramping time of 1 to 10 seconds. The shortest ramping time used (i.e., 1 second) yielded rectangular patches 52 which are 10 percent smaller than the optical spot size (i.e., the condensed laser beam 24 dimensions), while utilizing the longer ramping periods (i.e., 7.5 to 10 seconds) yielded rounded patches 52 which are 50 percent larger than the optical spot size. The ramp, or increase in power, is continuous and may be linear with time. However, other increasing continuous non-linear ramps may be used. Note that ramping periods less than 1 second have the same undesirable effect as pulses for the adhesion required in photomask applications. At a ramping time of 2 to 5 seconds, the deposited patch 52 is rectangular and is within 5 percent of the optical spot dimensions.

For substrates 12 which have greater thermal conductivities (i.e., quartz), the laser power must be increased in proportion to the thermal conductivity in order to obtain adhesive patches 52 exemplary for the regions of photomask processing (i.e., approximately 700 milliwatts in 2 seconds yields the same quality patch 52 on a quartz substrate as does 500 milliwatts for 2 seconds with a White Crown glass substrate). The required power to obtain patches 52 on quartz substrates 12 has been found to be 3 milliwatts per micron on target (i.e., power required is proportional to the square root of the optical spot area).

Note that the contact between the deposited metal patch 52 (e.g., gold) and the substrate surface 16 is sufficiently adhesive so as not to require the addition of any additional compound to the organometallic material 50 when the substrate surface 16 is mainly chromium. In the case where the substrate surface 16 is substantially a glass, the base metal content of the gold screen ink is increased by the addition of Engelhard titanium base metal resinate solution No. 9428 (7.2 percent titanium by weight) so that the gold screen ink is 92 percent by weight of the entire material 50, and the titanium resinate is 8 percent by weight. Furthermore, because of the strong adhesive characteristics achieved, no transparent protective shield need be applied over the patterned surface 16 of the photomask 10 before chemical scrubbing and washing. Thus, the contact between the substrate surface 16 and the deposited metal patch 52 in the transparent defect 18 has a higher bonding strength than that of previous methods.

The following Example is illustrative of the invention:

EXAMPLE

A mask was fabricated according to the procedure described in D. K. Atwood et al supra. To illustrate the possibility of feature reconstruction, metal lines were added to this mask by the inventive technique. In particular, a few drops of Engelhard Bright Gold NW9552 were placed in the center of the mask on the patterned side. The mask was then spun at 1000 rpm to produce a coating having a thickness of approximately 5.7 $\mu$m. The sample was then baked at 90 degrees C. for approximately 30 minutes. The sample was placed on the substrate holder of an exposure apparatus. This apparatus utilized an argon ion laser (5145 Angstroms) and an optical system which produced a 1.2 microns in diameter circular spot with a power of 1 milliwatt at the sample. The sample was exposed by translating it at a rate of 206 micrometers/second for a distance of typically 100 microns, thus producing a written line.

After exposure, the sample was immersed in trichlorothane for approximately 45 seconds. To remove small amounts of remaining residue, the sample was placed on the substrate holder of a plasma barrel etcher. The apparatus was evacuated to a pressure of approximately 0.05 Torr. A flow of oxygen was then established to yield a pressure of approximately 1.5 Torr. A plasma was struck utilizing an r.f. source (13.56 MHz) at a power input of 100 Watts. The plasma was extinguished after approximately 10 minutes. The resulting exposed and developed line was approximately 5 microns in width and showed a uniform cross section. The line was not totally reacted but was adhesive and contained enough gold to be opaque to X-rays.

We claim:

1. A process for fabricating a device comprising the steps of A) supplying radiant energy to a region comprising an organometallic material disposed on a substrate to induce a chemical reaction which results in the formation of 1) a region comprising a material chosen from the group consisting of metal and metal oxide and 2) volatile components and B) completing said device wherein at least a portion of said region that is unreacted is removed characterized in that during said reaction, an expedient is employed to limit heat generation so that the rate of energy generation from said reaction is less than 3 percent of the rate at which said energy is supplied.

2. The process of claim 1 wherein said expedient comprises the use of a ramped energy source when said organometallic undergoes an exothermic reaction.

3. The process of claim 2 wherein said organometallic comprises a gold screening ink.

4. The process of claim 1 wherein said organometallic comprises a material chosen from the group consisting of a gold screening ink, titanium carboxylate, and palladium acetate.

5. The process of claim 4 wherein the source of said energy comprises a laser.

6. The process of claim 1 wherein the source of said energy comprises a laser.

7. The process of repairing a mask comprising a pattern having opaque and transparent regions, said process comprising the steps of 1) forming a region comprising an organometallic material, said region overlying at least a portion of said mask and 2) subjecting at least a portion of said organometallic region to radiant energy to induce a chemical reaction and to result in the formation of a converted region which comprises a material chosen from the group consisting of metal and metal oxides characterized in that during said reaction, the rate of energy generation from said reaction is less than 3 percent of the rate at which said energy is supplied.

8. The process of claim 7 wherein said expedient comprises the use of a ramped energy source when said organometallic undergoes an exothermic reaction.

9. The process of claim 8 wherein said organometallic comprises a gold screening ink.

10. The process of claim 7 wherein said organometallic comprises a material chosen from the group consisting of a gold screening ink and palladium acetate.

11. The process of claim 10 wherein the source of said energy comprises a laser.

12. The process of claim 7 wherein the source of said energy comprises a laser.

13. The process of claim 12 wherein said mask comprises a photomask.

14. The process of claim 1 wherein said device comprises a photomask.

* * * * *